United States Patent [19]
Lee

[11] Patent Number: 5,994,913
[45] Date of Patent: *Nov. 30, 1999

[54] METHOD FOR ANALYZING DEFECTS IN A SEMICONDUCTOR

[75] Inventor: Nam Il Lee, Kyoungkido, Rep. of Korea

[73] Assignee: Hyundai Electronics Industries Co., Ltd., Kyoungkido, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/620,048

[22] Filed: Mar. 20, 1996

[30] Foreign Application Priority Data

Mar. 28, 1995 [KR] Rep. of Korea .......................... 95-6700

[51] Int. Cl.⁶ ..................................................... G01R 31/28
[52] U.S. Cl. ...................... 324/765; 324/73.1; 324/158.1
[58] Field of Search ............................... 324/158.1, 73.1, 324/96, 750, 752, 765, 719, 716; 248/126; 382/8; 356/237; 438/14, 17; 257/40, 48

[56] References Cited

U.S. PATENT DOCUMENTS

| 4,659,220 | 4/1987 | Bronte et al. ............................ 356/237 |
| 4,697,245 | 9/1987 | Kara et al. ................................ 364/552 |
| 4,794,647 | 12/1988 | Forgues et al. ................................ 382/8 |
| 4,965,515 | 10/1990 | Karasawa ................................ 324/73.1 |
| 5,125,040 | 6/1992 | Matsui et al. ................................ 382/8 |

FOREIGN PATENT DOCUMENTS

| 0555018 A1 | 8/1993 | European Pat. Off. . |
| 3-174738 | 7/1991 | Japan . |
| 4-225252 | 8/1992 | Japan . |
| 2291267A | 1/1996 | United Kingdom . |
| WO89/02122 | 3/1989 | WIPO . |
| WO94/27136 | 11/1994 | WIPO . |

*Primary Examiner*—Vinh P. Nguyen
*Attorney, Agent, or Firm*—Jacobson, Price, Holman & Stern, PLLC

[57] ABSTRACT

In order to verify whether defects generated when the manufacturing process is in progress results in the electric failures during the operation of the devices, and to verify which process the defects which cause electric failures are generated in, there is provided a method for analyzing defects in a semiconductor device, including the steps of: measuring the positions of physical defects generated in each process; converting the positions of said the physical defects into logic row/column address data; and comparing said logic row/column address data converted from positions of said physical defects with electric failure data which are measured after the overall processes are completed.

3 Claims, 3 Drawing Sheets

METHOD FOR ANALYZING DEFECTS IN A SEMICONDUCTOR

BACKGROUND OF THE INVENTION

1. Field of the Invention

The present invention relates to a method for analyzing defects in a semiconductor device, and more particularly, to a method for easily analyzing the cause of a device failure and the processing step to generate the device failure by making a comparison between the defects generated at the time of manufacturing the device and the electric failure information by the electric measurement after the overall processes are completed.

2. Description of Prior Art

In general, defective data, which are obtained by an equipment detecting process defects, are classified into two types. The first defective data, that the defect inspecting equipment detects when the manufacturing process for a device is in progress, express the physical positions of the defects and the size thereof, and the second defective data, the electric failure, that the electric inspecting equipment detects after the overall processes are completed, express their position as logic row/column addresses.

Although the two types of data mentioned above show defects caused by the manufacturing process of the device, these data can not be interchanged since it is impossible to compare the first defective data with the second defective data. Accordingly, the conventional detecting method using the two types of data capable which are not comparable has problems in that the duplicate defect analyses are unnecessarily performed by the two types of defective data, it is difficult to know whether the defects generated at the time of manufacturing the device cause the electric failures, and there must be a need for deprocess to verify which process the defects which cause the electric failures are generated in.

SUMMARY OF THE INVENTION

An object of the present invention is to provide a method for verifying whether defects generated when the manufacturing process is in progress results in electric failures during the operation of the devices.

Another object of the present invention is to provide a method for verifying which process the defects which cause electric failures are generated in.

In accordance with an aspect of the present invention, there is provided a method for analyzing defects in a semiconductor device, comprising the steps of: measuring the positions of the physical defects generated in each process; converting the positions of said physical defects into logic row/column address data; and comparing said logic row/column address data converted from positions of said physical defects with electric failure data which are measured after the overall process are completed.

BRIEF DESCRIPTION OF THE DRAWINGS

Other objects and aspects of the present invention will become apparent from the following description of embodiments with reference to the accompanying drawings, in which.

DETAIL DESCRIPTION OF PREFERRED EMBODIMENT

Hereinafter, an embodiment of the present invention will be described below in detail referring FIGS. 1 to 3.

First, the present invention converts the process defective data(the first defective data) which are generated in the manufacturing process and the electrically inspected data (the second defective data), which can not directly be compared with the process defective data, into the same type of data capable of comparing the above two data so that the relationship between the process defective data and the electrically inspected data can be examined. That is to say, after converting the process defective data into row/column address values, these two data are compared. With the above data conversion, an inspector can verify whether the process defects cause the electric failure which is generated when the overall process steps are fully completed, and which process the process defects resulting in the electric failure is generated in.

Figure 1:
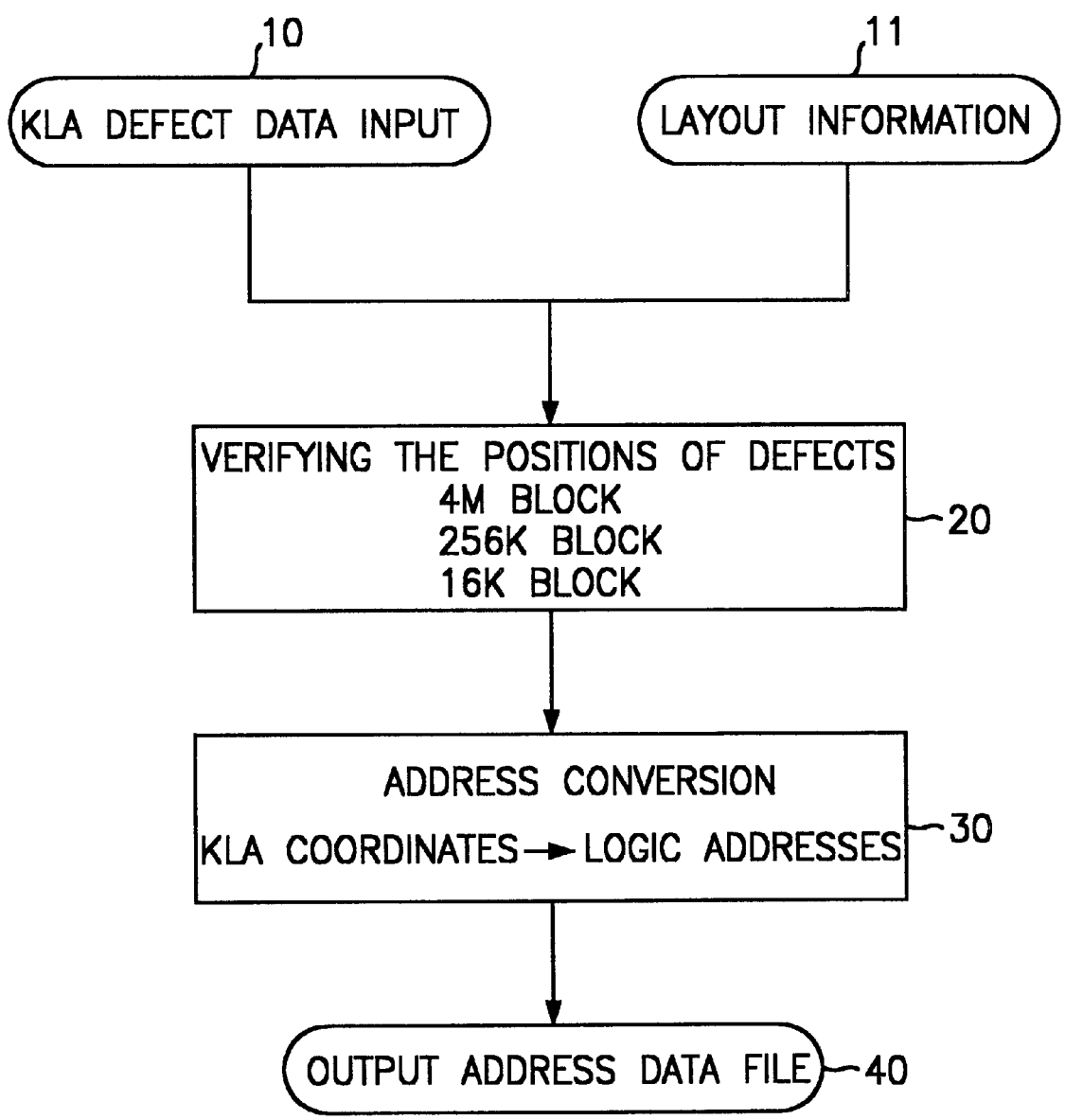
FIG. 1 is a flow chart illustrating the coordinate transformation according to the present invention.

FIG. 1 illustrates how to convert electrically inspected data into the physical position coordinate values(the process defects), which are measured at the time of manufacturing the device by the defect measuring equipment (hereinafter, referred to as the KLA equipment).

As shown in FIG. 1 the defect position values are converted into the row/column address values by inspecting which cell array block the defects exist in and which row/column they are associated with, using the KLA defective data and the layout information of a device. A detailed description will be described below.

KLA Defective Data

As shown in table <1> and step 10 of FIG. 1, the KLA defective data are expressed as a physical position (LOC-X, LOC-Y) and a size (SIZE-X, SIZE-Y) from a reference point on the cartesian coordinate system

TABLE 1 physical positions of defects, (LOC-X, LOC-Y)
sizes of defects, (SIZE-X, SIZE-Y)

Layout Information

Figure 2:
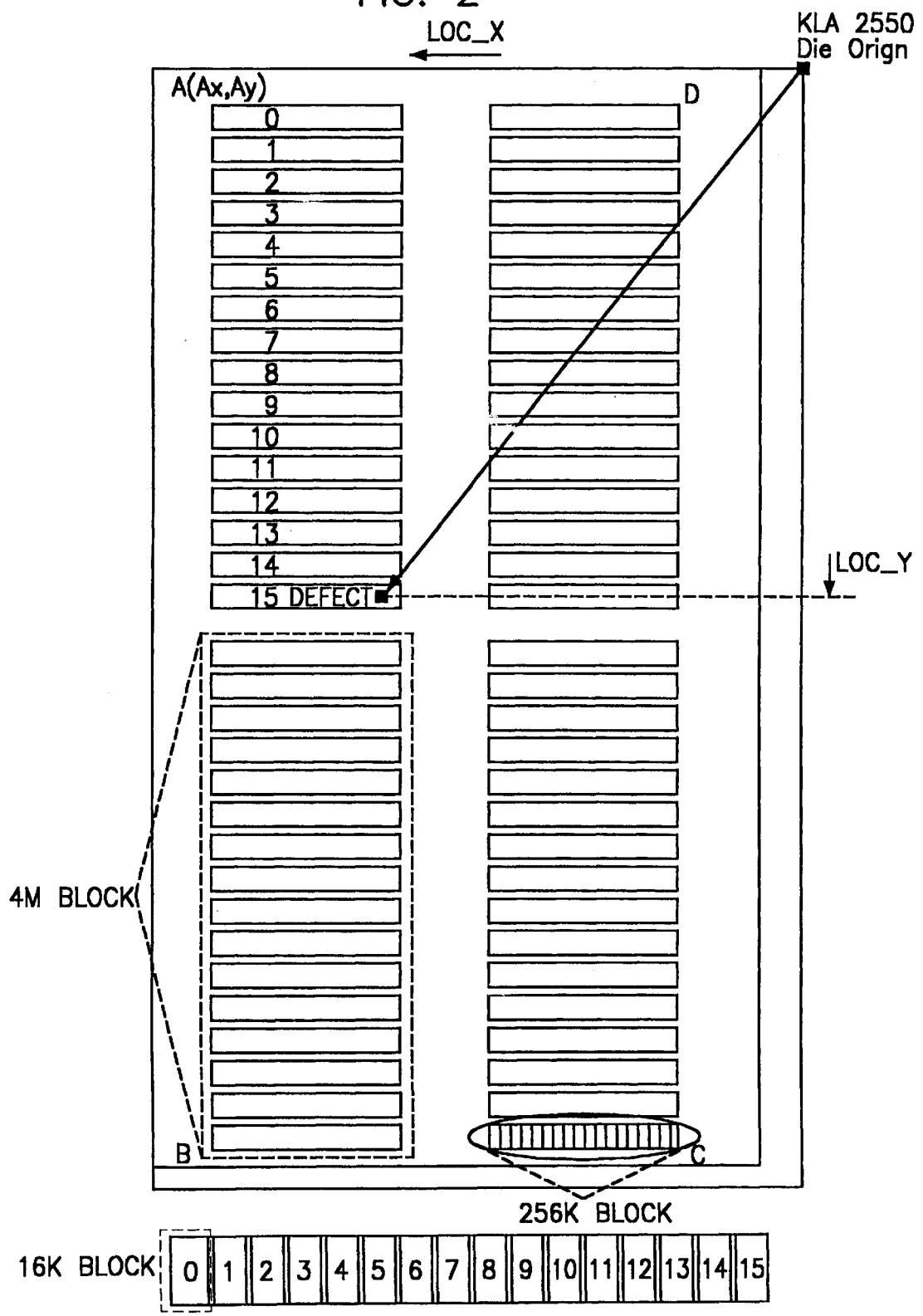
FIG. 2 is a layout of a 16M DRAM according to the present invention.

For example, the layout of 16M DRAM can be expressed as shown in step 11 of FIG. 1 and FIG. 2, and table <2> shows the contents of the layout information.

TABLE 2

| | |
|---|---|
| a reference coordinates | § $(A_X, A_Y)$ $(B_X, B_Y)$ $(C_X, C_Y)$ $(D_X, D_Y)$ |
| b 4 M block(large block) | No: L-BLK-NO |
| c 256K block(middle block) | No: M-BLK-NO |
| | size: M-BLK-X, M-BLK-Y |
| | space: M-BLK-S |
| d 16K block(small block) | No: S-BLK-NO |
| | size: S-BLK-X, S-BLK-Y |
| | space: S-BLK-S |
| e cell | size: CELL-X, CELL-Y |

The data values of table <2> are expressed as arbitrary characters.

The row/column address values of the device become increasing from the reference of each cell array block, and the coordinate values of these reference points (A, B, C and D in FIG. 2) are expressed as $(A_x, A_Y)$ $(B_x, B_Y)$ $(C_x, C_Y)$ $(D_x, D_Y)$ in layout information.

As shown in FIG. 2, in case of 16M DRAM, the arrangement is as follows:

16M block=4M block×4

4M block=256K block×16

256K block=16K block×16

As shown in items b, c and d of table <2>, information is needed about the size of each block, the space between blocks, and the size of the unit cell which is expressed in the layout information as shown in item e of table <2>.

Positions of Defects

The following table <3> illustrates the order to look for the positions of defects detected by the KLA equipment according to the order of items a, b and c

TABLE 3 a.  L_BLK_NO:
    IF[ (LOC_X > (Ax + Dx) / 2 ) & (LOC_Y > (Ay+By) / 2)] → L_BLK_NO = DQ0
b.  M_BLK_NO = TRUNC [ (LOC_Y - Ay) / (M_BLK_Y + M_BLK_S) ]
c.  S_BLK_NO = TRUNC [(Ax - LOC_X) / (S_BLK_X + S_BLK_S) ]

a. As shown in step 20 of FIG. 1, calculates which of four 4M blocks the defects exist in, using the KLA defective data (LOC-X, LOC-Y) expressing the positions of defects and coordinate values $(A_x, A_y)$ $(B_x, B_y)$ $(C_x, C_y)$ $(D_x, D_y)$ of the cell array reference point (A, B, C, D).

b. Calculates which of sixteen 256K blocks the defects exist in.

c. Calculates which of sixteen 16K blocks the defects exist in.

Coordinate Transformation

After calculating which of the cell array blocks the process defects exist in, the positions of the defects are converted into the row/column address values exclusive of the redundancy (or dummy) row/column (KR/KC) using the following table <4>, as shown in step 30 of FIG. 1 so that the positions of the defects may correspond to the cell array.

TABLE 4 a.  row address
    =[{(LOC_Y-Ay) - (M_BLK_S × M_BLK_NO)} / CELL_Y] * 2 + KR
    KR: redundancy row
b.  column address
    =[{(Ax-LOC_X) - (S_BLK_S × S_BLK_NO)} / 2 (2*CELL_X)] + KR
    KC: redundancy column Since the coordinate transformation, as shown in step 30 of FIG. 1, using table <4> converts the position of the defects into the row/column address values outputted as an output address data file as shown in step 40 of FIG. 1, which is the same type as the electrically inspected data, the defected information can be compared with the layout information. That is, it is possible to verify whether the process defects cause the electric failures. It is also possible to verify the correct position of a defect and the process where the defect is generated, and to verify the type of failure from the result of the electric inspection, such that it is possible to grasp other defects all-around with respect to the defect.

Table <5> shows the positions of the defects, which are divided into two types, for example, defect A and defect B, according to an embodiment of the present invention.

TABLE 5

|  | (μm) | |
|---|---|---|
|  | positions of defects | |
|  | (X, Y) | |
| process | defect A | defect B |
| ISO-PR | ( 6139.31, 10012.38 ) |  |
| PI-PR | ( 6139.78, 10003.95 ) |  |
| IPO2-DEP | ( 6140.66, 9985.32 ) |  |
| P3-PR | ( 6136.47, 10002.43 ) | ( 1562.96, 3060.10 ) |
| MI-E | ( 6136.21, 10000.69 ) | ( 1566.41, 3064.13 ) |

At this time, after completing the manufacturing process, the results of the electric inspection data are shown in the following table <6>.

TABLE 6

| defect A' | defect B' |
|---|---|
| DQ1 ( A00 - AFF, 01B - 01C ) ( A42 - A43, 000 - 3FF ) | DQ3 ( 68D - 68E, 1E6 - 1E7 ) |

*DQ1 and DQ3 are I/O ports, and the row/column address values are expressed as a hexadecimal notation.

Table <7> shows the converted data when the process defective data are converted into the row/column address values using the coordinate transformation of table <4>.

| defect A | defect B |
|---|---|
| DQ1 ( A42, 01B ) | DQ3 ( 68D, 1E6 ) |

Comparing the electrically inspected data with the process defective data converted into hexadecimal notation, the inspector can verify if the failures, defects A' and B', from the electric inspection are caused by the process defects A and B, respectively. Accordingly, the inspector can verify if defect A causes the cross-failure because it is found in all the processes, ISO-PR to MI-E. Also, the inspector can verify if defect B causes the bit-failure.

Figure 3:
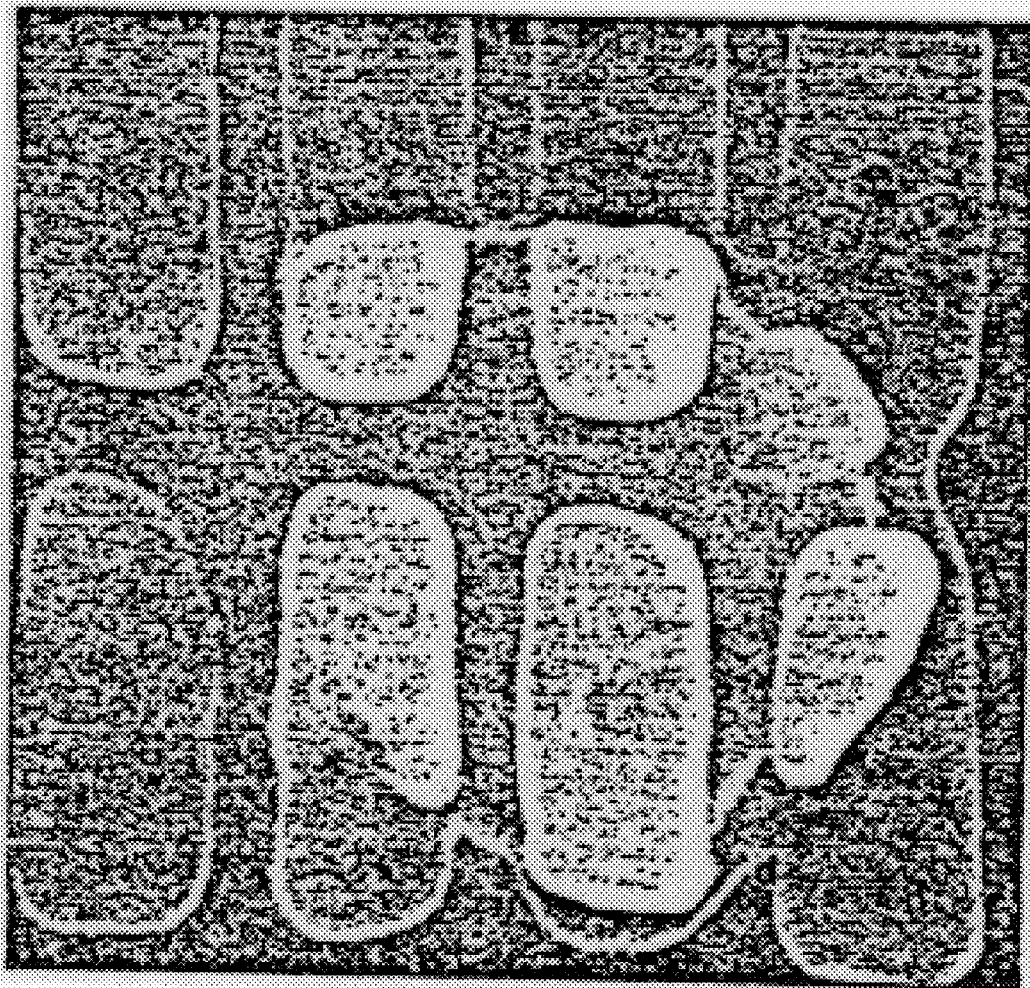
FIG. 3 is a photograph, showing defects generated in a device, taken by a scanning electro microscope(SEM).

FIG. 3 is a photograph, showing defect B generated in a device, taken by a scanning electro microscope, and shows that the analysis by the coordinate transformation data, according to the present invention, and the analysis by the actual deprocess coincide.

As apparent from the above description, the present invention has effects on the verification of the positions of the electric failures, on the verification of the types of defects without discontinuing the process, and on the improvement of yield from the quick and correct failure analysis.

Although the preferred embodiment of the present invention has been disclosed for illustrative purpose, those skilled in the art will appreciate that various modifications, additions and substitutions are possible, without departing form the scope and spirit of the invention as disclosed in the accompanying claims.

What is claimed is:

1. A method for analyzing defects in a semiconductor device which is manufactured in a plurality of fabrication process steps, comprising:

selecting positions of the defects generated in each fabrication process step;

converting said positions of said defects into logic row/column address data; and comparing said logic row/column address data obtained from said positions of said defects with electrical failure data of the semiconductor device which are measured after the fabrication process steps are completed.

2. A method in accordance with claim 1, wherein the step of converting the positions of said defects into logic row/column address data uses layout information of said device.

3. A method in accordance with claim 1, wherein the step of detecting is conducted by KLA equipment.

* * * * *